(12) United States Patent
Uchihara et al.

(10) Patent No.: US 8,482,060 B2
(45) Date of Patent: Jul. 9, 2013

(54) SEMICONDUCTOR DEVICE

(75) Inventors: Takeshi Uchihara, Saitama-ken (JP);
Yusuke Kawaguchi, Kanagawa-ken (JP); Keiko Kawamura, Kanagawa-ken (JP); Hitoshi Shinohara, Tokyo (JP); Yosefu Fujiki, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 296 days.

(21) Appl. No.: 13/052,917

(22) Filed: Mar. 21, 2011

(65) Prior Publication Data
US 2012/0061747 A1      Mar. 15, 2012

(30) Foreign Application Priority Data
Sep. 9, 2010   (JP) .................... 2010-201874

(51) Int. Cl.
*H01L 29/772*      (2006.01)
(52) U.S. Cl.
USPC ........................................ 257/330
(58) Field of Classification Search
USPC ............... 257/329–332, 328, 367, 386, 400, 257/409, 653, E29.262
See application file for complete search history.

(56) References Cited

U.S. PATENT DOCUMENTS

| 5,969,378 | A * | 10/1999 | Singh .......................... 257/77 |
| 5,981,996 | A * | 11/1999 | Fujishima .................... 257/335 |
| 6,525,375 | B1 * | 2/2003 | Yamaguchi et al. ......... 257/341 |
| 6,670,673 | B2 * | 12/2003 | Sakakibara ................... 257/328 |
| 6,781,201 | B2 * | 8/2004 | Yamaguchi ................... 257/331 |
| 6,836,001 | B2 * | 12/2004 | Yamauchi et al. ............ 257/627 |
| 6,853,033 | B2 * | 2/2005 | Liang et al. ................... 257/339 |
| 6,867,456 | B2 * | 3/2005 | Sakakibara ................... 257/330 |
| 7,553,722 | B2 * | 6/2009 | Sakakibara et al. ......... 438/246 |
| 7,564,095 | B2 * | 7/2009 | Urakami et al. .............. 257/330 |
| 7,825,449 | B2 * | 11/2010 | Suzuki et al. ................. 257/301 |

(Continued)

FOREIGN PATENT DOCUMENTS

| JP | 5136420 | 6/1993 |
| JP | 8264764 | 10/1996 |
| JP | 2001-274398 | 10/2001 |

*Primary Examiner* — Hsien Ming Lee
*Assistant Examiner* — Michele Fan
(74) *Attorney, Agent, or Firm* — Patterson & Sheridan, LLP

(57) ABSTRACT

According to one embodiment, a semiconductor device includes a drift region of a first conductivity type, a base region of a second conductivity type, a source region of the first conductivity type, a gate electrode in a trench shape, a contact region of the second conductivity type, a drain electrode, and a source electrode. The drift region is selectively provided in a drain layer of the first conductivity type from a surface of the drain layer to an inside of the drain layer. The base region is selectively provided in the drift region from a surface of the drift region to an inside of the drift region. The source region is selectively provided in the base region from a surface of the base region to an inside of the base region. The gate electrode penetrates from a part of the source region through the base region adjacent to the part of the source region to reach a part of the drift region in a direction substantially parallel to a major surface of the drain layer. The contact region is selectively provided on the surface of the drift region. The contact region contains an impurity having a concentration higher than an impurity concentration of the base region. The drain electrode is connected to the drain layer. The source electrode is connected to the source region and the contact region. The contact region extends from a side of the drain layer toward the drift region and does not contact the drain layer.

15 Claims, 16 Drawing Sheets

U.S. PATENT DOCUMENTS

| | | | |
|---|---|---|---|
| 8,143,124 B2* | 3/2012 | Challa et al. | 438/270 |
| 2005/0139909 A1* | 6/2005 | Miura | 257/330 |
| 2006/0076614 A1* | 4/2006 | Ninomiya | 257/330 |
| 2006/0244056 A1* | 11/2006 | Miura | 257/330 |
| 2007/0114599 A1* | 5/2007 | Hshieh | 257/330 |
| 2008/0035992 A1* | 2/2008 | Kawaguchi et al. | 257/331 |
| 2008/0038890 A1* | 2/2008 | Tucker | 438/270 |
| 2008/0099837 A1* | 5/2008 | Akiyama et al. | 257/341 |
| 2009/0114969 A1* | 5/2009 | Suzuki et al. | 257/301 |
| 2009/0121285 A1* | 5/2009 | Kawamura et al. | 257/330 |
| 2009/0146209 A1* | 6/2009 | Akiyama et al. | 257/334 |
| 2009/0166730 A1* | 7/2009 | Okuno et al. | 257/330 |
| 2010/0013010 A1* | 1/2010 | Akiyama et al. | 257/334 |
| 2010/0078707 A1* | 4/2010 | Haeberlen et al. | 257/328 |
| 2010/0102383 A1* | 4/2010 | Izumi | 257/330 |
| 2010/0327313 A1* | 12/2010 | Nakamura | 257/133 |
| 2011/0220991 A1* | 9/2011 | Takaya | 257/330 |
| 2012/0037983 A1* | 2/2012 | Hshieh | 257/334 |

* cited by examiner

SEMICONDUCTOR DEVICE

CROSS-REFERENCE TO RELATED APPLICATIONS

This application is based upon and claims the benefit of priority from the prior Japanese Patent Application No. 2010-201874, filed on Sep. 9, 2010; the entire contents of which are incorporated herein by reference.

FIELD

Embodiments described herein relate generally to a semiconductor device.

BACKGROUND

In power semiconductor devices, it is required to reduce on-resistances while keeping the high breakdown voltage. In recent years, it is shifted from planar MOSFETs (Metal Oxide Semiconductor Field Effect Transistors) to vertical MOSFETs to meet such requirement. In the vertical MOSFETs, since a channel region is formed in a direction substantially perpendicular to a major surface of a semiconductor substrate, a channel density is increased and reduction in on-resistances can be achieved.

Moreover, to realize still higher breakdown voltage and a further reduction in the on-resistances, three-dimensional semiconductor devices have been considered in which channel regions are provided not only on the major surface but also in a vertical direction of the semiconductor substrate. In the three-dimensional semiconductor device, a source region, a base region and a drain region are provided so as to extend respectively in a direction substantially perpendicular to the major surface of the semiconductor substrate and further a gate electrode in a trench shape is provided. According to the semiconductor device of the foregoing structure, channel regions are formed both in a direction substantially parallel to and in a direction substantially perpendicular to the major surface of the semiconductor substrate. With this structure, a significant improvement in channel density can be realized. As a result, the three-dimensional semiconductor device realizes a reduction in on-resistances while keeping the high breakdown voltage.

However, in the three-dimensional semiconductor device, when the semiconductor device is switched between the on-state and the off-state, a rapid increase in potential difference occurs between the source electrode and the drain electrode, resulting in a temporary overvoltage. For this reason, an avalanche breakdown may occur in the vicinity of the base region and the lower end part of the gate electrode.

Carriers generated in the avalanche breakdown are discharged to the source electrode side via the base region. However, in the three-dimensional semiconductor device, because the base region is formed in depth, carries are likely to stay in the base region. Therefore, a potential in the base region rises, and a bipolar action may be caused by a parasitic bipolar transistor. Furthermore, if this bipolar action occurs in a chain, a device breakdown may occur by a so-called "latch-up". Therefore, it is desirable to realize a further improvement in the breakdown voltage for the three-dimensional semiconductor device.

BRIEF DESCRIPTION OF THE DRAWINGS

FIG. 2A is a schematic perspective view of a main part of the semiconductor device, and FIG. 2B is a schematic cross-sectional view of a main part along line X-Y of FIG. 2A;

FIG. 4A is a schematic perspective view of a main part of a process of forming a mask on the surface of a semiconductor substrate, and FIG. 4B is a schematic perspective view of a main part of a process of etching the semiconductor substrate;

FIG. 5A is a schematic perspective view of a main part of a process of forming an epitaxial layer, and FIG. 5B is a schematic perspective view of a main part of a process of forming a mask;

FIG. 6A is a schematic perspective view of a main part of a process of etching the semiconductor substrate, and FIG. 6B is a schematic perspective view of a main part of a process of forming a gate electrode;

FIG. 7A is a schematic perspective view of a main part of a process of implanting ions into the semiconductor substrate, and FIG. 7B is a schematic perspective view of a main part of a process of forming a mask;

FIG. 8A is a schematic perspective view of a main part of a process of etching the semiconductor substrate, and FIG. 8B is a schematic perspective view of a main part of a process of forming an insulating film;

FIG. 9A is a schematic perspective view of a main part of the semiconductor device, and FIG. 9B is a schematic cross-sectional view of a main part along line X-Y of FIG. 9A;

FIG. 11A is a schematic perspective view of a main part of the semiconductor device, and FIG. 11B is a schematic cross-sectional view of a main part along line X-Y of FIG. 11A;

FIG. 14A is a schematic perspective view of a main part of the semiconductor device, and FIG. 14B is a schematic cross-sectional view of a main part along line X-Y of FIG. 14A;

FIG. 15A is a schematic perspective view of a main part of the semiconductor device, and FIG. 15B is a schematic cross-sectional view of a main part along line X-Y of FIG. 15A; FIG. 16A is a schematic perspective view of a main part of the semiconductor device, and FIG. 16B is a schematic cross-sectional view of a main part along line X-Y of FIG. 16A.

DETAILED DESCRIPTION

In general, according to one embodiment, a semiconductor device includes a drift region of a first conductivity type, a base region of a second conductivity type, a source region of the first conductivity type, a gate electrode in a trench shape, a contact region of the second conductivity type, a drain electrode, and a source electrode. The drift region is selectively provided in a drain layer of the first conductivity type from a surface of the drain layer to an inside of the drain layer. The base region is selectively provided in the drift region from a surface of the drift region to an inside of the drift region. The source region is selectively provided in the base region from a surface of the base region to an inside of the base region. The gate electrode penetrates from a part of the source region through the base region adjacent to the part of the source region to reach a part of the drift region in a direction substantially parallel to a major surface of the drain layer. The contact region is selectively provided on the surface of the drift region. The contact region contains an impurity having a concentration higher than an impurity concentration of the base region. The drain electrode is connected to the drain layer. The source electrode is connected to the source region and the contact region. The contact region extends from a side of the drain layer toward the drift region and does not contact the drain layer.

Embodiments of the invention will now be described with reference to the drawings.

Figure 1:
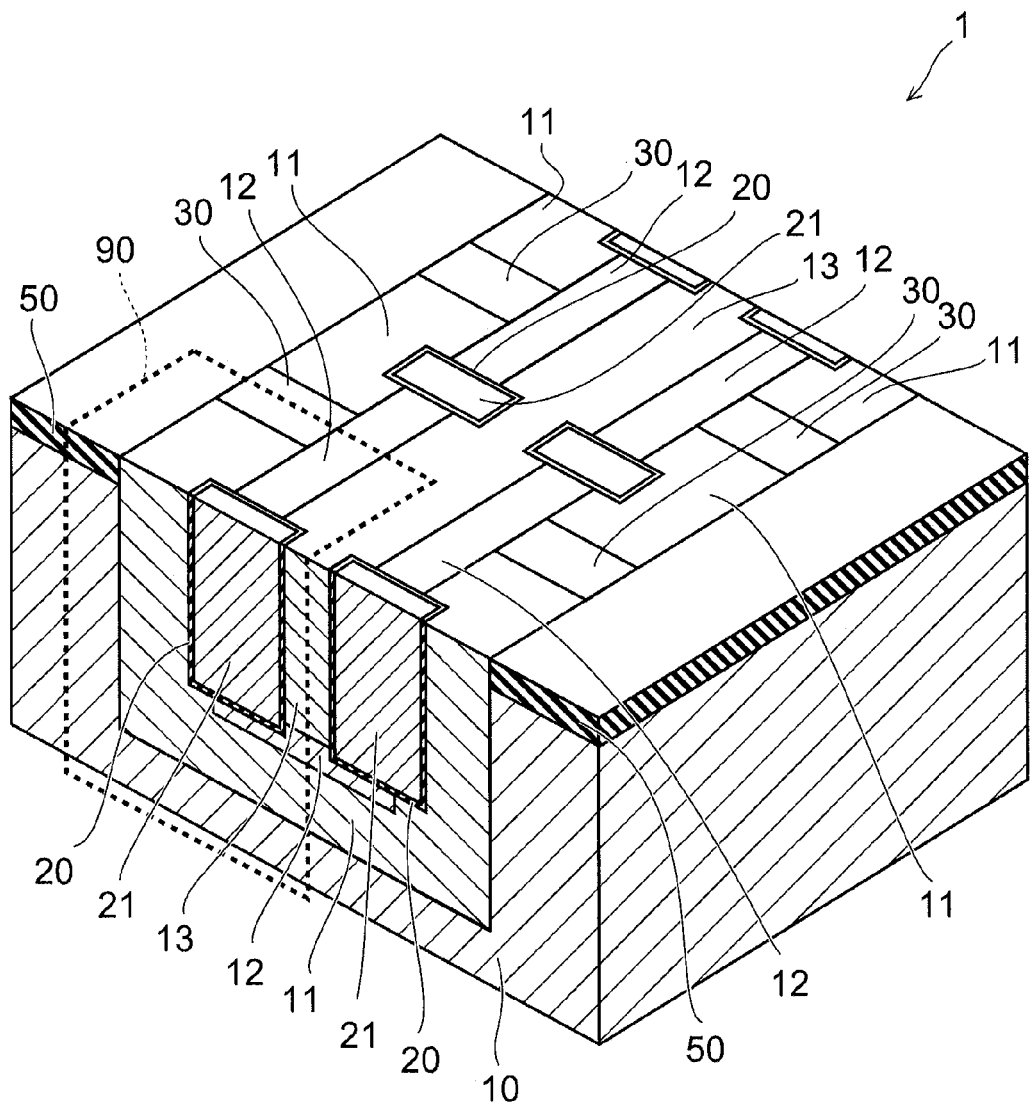
FIG. 1 is a schematic perspective view of a main part of a semiconductor device according to a first embodiment.

FIG. 1 is a schematic perspective view of a main part of a semiconductor device according to a first embodiment. FIG. 1 shows an entire view of the semiconductor device according to the first embodiment.

Figure 2A:
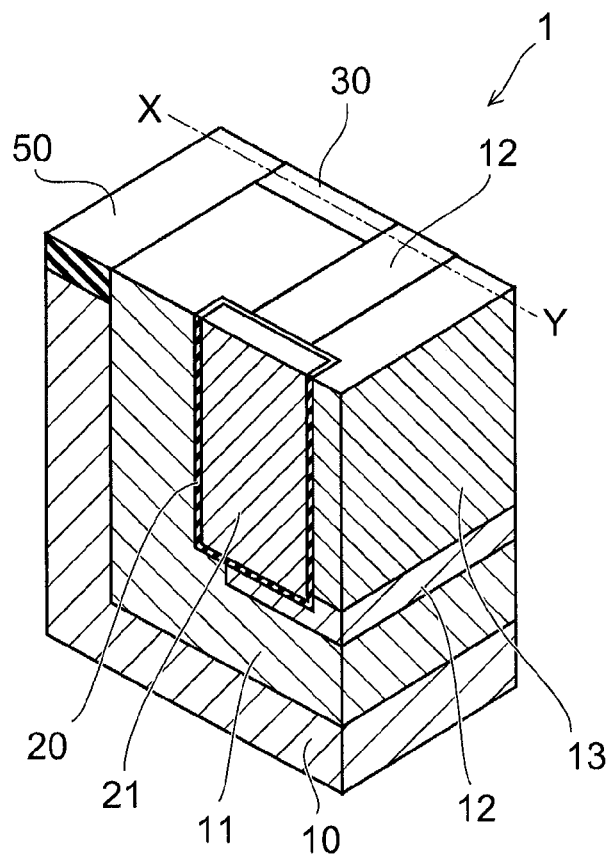
FIGS. 2A and 2B are schematic views of main parts of the semiconductor device according to the first embodiment, where
Figure 2B:
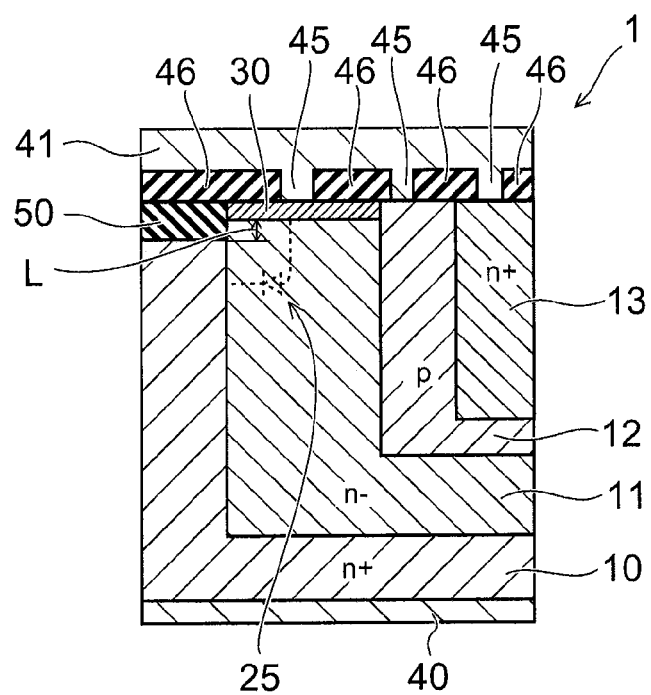

FIGS. 2A and 2B are schematic views of main parts of the semiconductor device according to the first embodiment. Specifically, FIG. 2A is a schematic perspective view of a main part of the semiconductor device, and FIG. 2B is a schematic cross-sectional view of a main part along line X-Y of FIG. 2A. Neither a drain electrode 40 nor a source electrode 41 shown in FIG. 2B are shown in FIG. 1 and FIG. 2A.

Figure 3:
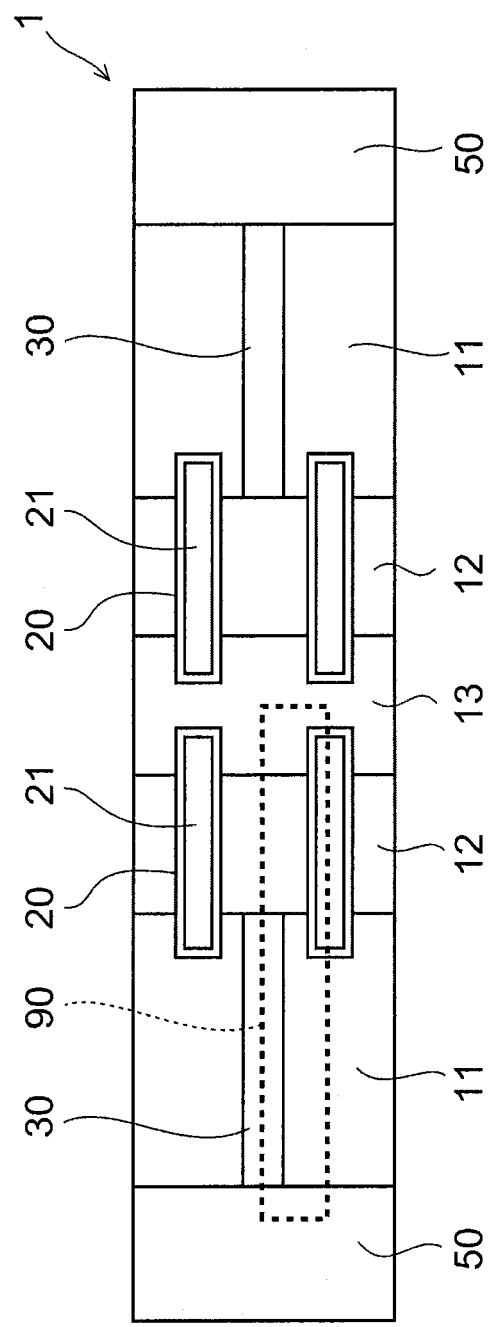
FIG. 3 is a schematic plan view of a main part of the semiconductor device according to the first embodiment.

FIG. 3 is a schematic plan view of a main part of the semiconductor device according to the first embodiment. FIG. 2A and FIG. 2B illustrate the portion enclosed by a region 90 shown in FIG. 1 and a region 90 shown in FIG. 3.

A semiconductor device 1 is a three-dimensional MOSFET. As shown in FIGS. 1, 2A and 2B, the semiconductor device 1 includes an n$^+$-type drain layer 10, and an insulating layer 50 is provided on the drain layer 10. A drift region 11 is selectively provided from the surface of the insulating layer 50 to the inside of the drain layer 10. The drain layer 10 has an n-impurity concentration higher than that of the drift region 11. A p-type base region 12 is selectively provided from the surface of the drift region 11 to the inside thereof. An n-type source region 13 is selectively provided from the surface of the base region 12 to the inside thereof.

A gate electrode 21 is selectively provided from the respective surfaces of the base region 12, a part of the source region 13 adjacent to the base region 12, and a part of the drift region 11 provided on the opposite side of the above part of the source region 13 having the base region 12 in between to the inside thereof via a gate insulating film 20. The gate electrode 21 is formed in a trench shape and penetrates from the part of the source region 13 through the base region 12 adjacent to the above part of the source region 13 to reach a part of the drift region 11 in a direction substantially parallel to the major surface of the drain layer 10. The lower end of the gate insulating film 20 is positioned between the lower end of the base region 12 and the lower end of the source region 13. On the surface of the drift region 11, a p$^+$-type contact region 30 is selectively provided from the side of the drain layer 10 toward the drift region 11. The contact region 30 is adjacent to the base region 12. The contact region 30 has an impurity concentration higher than that of the base region 12. The contact region 30 is, for example, a carrier extraction region which allows carriers (holes, for instance) generated in the semiconductor device 1 to be discharged to the source electrode 41.

The drain electrode 40 is connected to the drain layer 10. A source electrode 41 is connected to the source region 13, the base region 12 and the contact region 30 via a via electrode 45. An interlayer insulating film 46 is provided between the source electrode 41, and the drift region 11, the base region 12 and the source region 13. The insulating layer 50 is provided on the surface of the drain layer 10 under the interlayer insulating film 46. The insulating layer 50 is adjacent to the contact region 30. A step of a length L is provided between the lower surface of the contact region 30 and the lower surface of the insulating layer 50. The drift region 11 and the insulating layer 50 are provided between the contact region 30 and the drain layer 10.

In the semiconductor device 1, the p$^+$-type contact region 30 is provided in the vicinity of the n$^+$-type drain layer 10 via the n$^-$-type drift region 11. Thus, a pn diode 25 is formed between the source electrode 41 and the drain electrode 40, in which the contact region 30 is the p-side, and the drain layer 10 is the n-side. The pn diode 25 is formed in the vicinity of the insulating layer 50.

As shown in FIG. 3, in the plane of the semiconductor device 1, the contact region 30 is sandwiched between the drift regions 11. The drift region 11 and the contact region 30 are adjacent to the base region 12. The base region 12 is adjacent to the source region 13 on the opposite side of the drift region 11 and the contact region 30. The gate electrode 21 is formed in parts of the base region 12, the source region 13 adjacent to the base region 12 and the drift region 11 adjacent to the base region 12. The gate insulating film 20 is provided between the gate electrode 21, and the drift region 11, the base region 12 and the source region 13. The contact region 30 is located between the gate electrodes 21 that extend to the drift region 11. The source region 13 is sandwiched between the base regions 12, and the source region 13 and the base region 12 are sandwiched between the drift regions 11.

In the plane of the semiconductor device 1, the drift regions 11, the base regions 12, and the gate electrodes 21 are arranged to be line symmetrical with the source region 13 as the center. The drift region 11 and the contact region 30 are adjacent to the insulating layer 50. The insulating layer 50 is adjacent also to the base region 12. In the semiconductor device 1, for example, units shown in FIG. 3 are periodically arranged in a direction parallel to the major surface of the drain layer 10 as shown in FIG. 1.

The main component of the drain layer 10, the drift region 11, the base region 12, the source region 13, and the contact region 30 is a semiconductor such as silicon (Si) and the like. The gate electrode 21 is made of a material such as polysilicon. The gate insulating film 20, the interlayer insulating film 46, and the insulating layer 50 are made of a material such as silicon oxide ($SiO_2$) or the like. The drain electrode 40 and the source electrode 41 are made of a material such as copper (Cu), aluminum (Al), or the like.

Next, manufacturing processes of the semiconductor device 1 will be described.

Figure 4A:
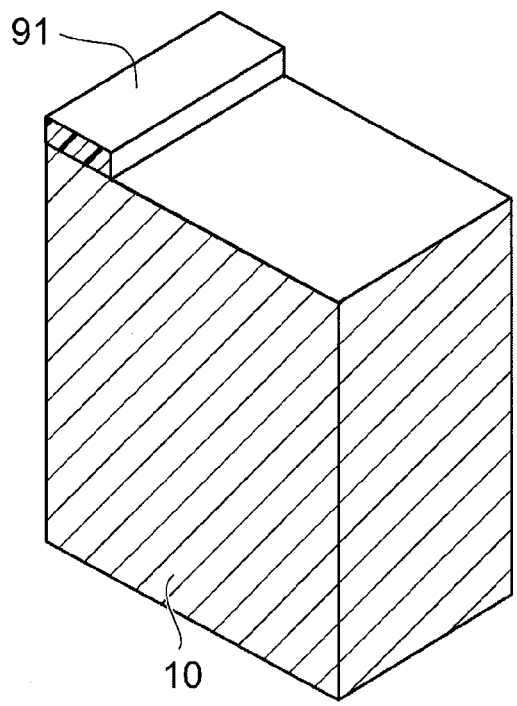
FIGS. 4A and 4B are schematic perspective views of main parts illustrating manufacturing processes of the semiconductor device according to the first embodiment, where
Figure 4B:
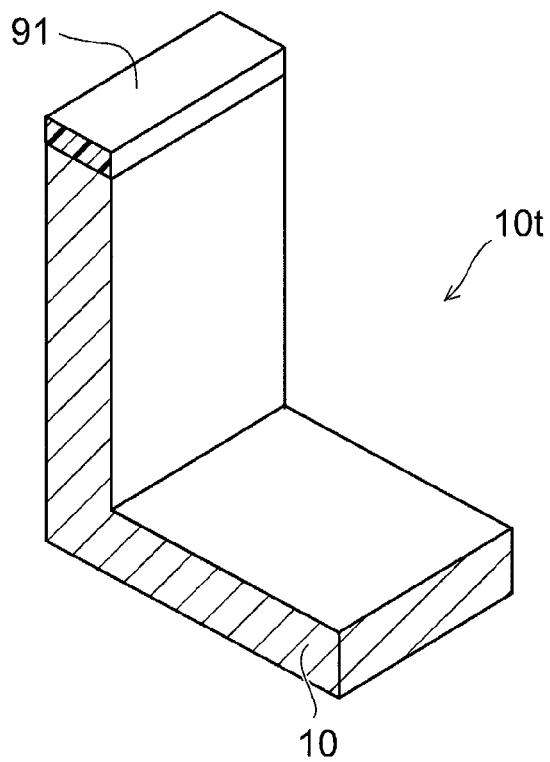

FIGS. 4A and 4B are schematic perspective views of main parts illustrating manufacturing processes of the semiconductor device according to the first embodiment. Specifically, FIG. 4A is a schematic perspective view of a main part of a process of forming a mask on the surface of the semiconductor substrate, and FIG. 4B is a schematic perspective view of a main part of a process of etching the semiconductor substrate.

First, as shown in FIG. 4A, the drain layer 10 that is a semiconductor substrate (the semiconductor wafer) is prepared. The impurity concentration of the drain layer 10 is set to, for example, $1 \times 10^{18}$ cm$^{-3}$ or higher. Then, a mask 91 is selectively formed on the surface of the drain layer 10. The mask 91 is made of a material such as silicon oxide ($SiO_2$) or the like.

Next, as shown in FIG. 4B, etching is selectively performed on the drain layer 10 exposed from the mask 91. As a result, a trench 10t is formed from the surface of the drain layer 10 to the inside thereof.

Figure 5A:
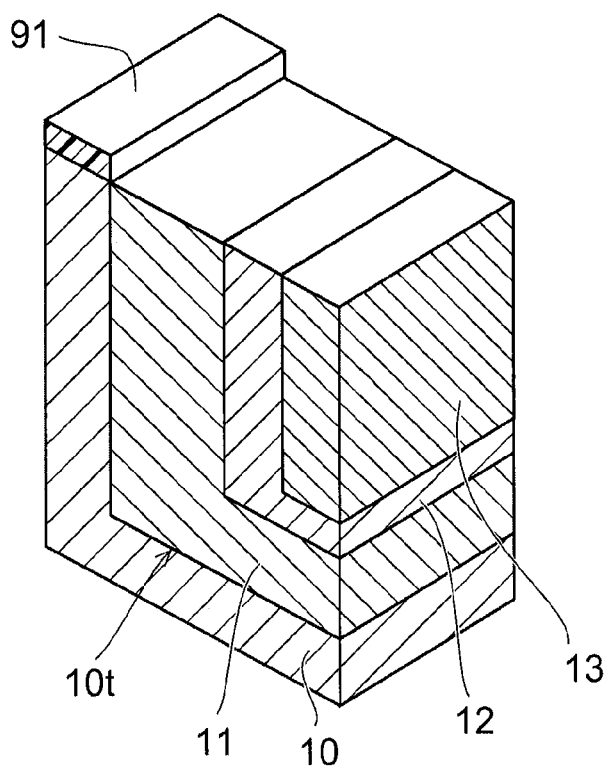
FIGS. 5A and 5B are schematic perspective views of main parts illustrating manufacturing processes of the semiconductor device according to the first embodiment, where
Figure 5B:
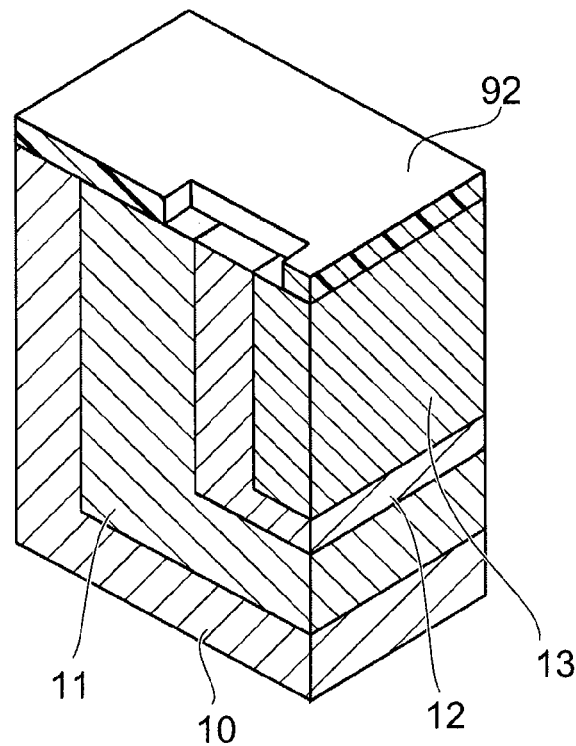

FIGS. 5A and 5B are schematic perspective views of main parts illustrating manufacturing processes of the semiconductor device according to the first embodiment. Specifically, FIG. 5A is a schematic perspective view of a main part of a process of forming an epitaxial layer, and FIG. 5B is a schematic perspective view of a main part of a process of forming a mask.

As shown in FIG. 5A, the n-type drift region 11 is formed in the trench 10t by the epitaxial growth method. The impurity concentration of the drift region 11 is set, for example, in a range of $1 \times 10^{12}$ cm$^{-3}$ to $1 \times 10^{13}$ cm$^{-3}$. As a result, the drift region 11 is formed from the surface of drain layer 10 to the inside thereof.

For the growth of the drift region 11, it is interrupted on the way, and the p-type base region 12 is formed by the epitaxial growth method in the trench 10t that remains in the drift region 11. As a result, the base region 12 is formed from the surface of the drift region 11 to the inside thereof.

Furthermore, the growth of the base region 12 is interrupted on the way, and the n$^+$-type source region 13 is formed by the epitaxial growth method in the trench 10t that remains in the base region 12. As a result, the source region 13 is selectively formed from the surface of the base region 12 to the inside thereof.

Thereafter, the CMP (Chemical Mechanical Polishing) is performed on the surfaces of the drift region 11, the base region 12, and the source region 13. As a result, the surfaces of the drift region 11, the base region 12, and the source region 13 can be made flat. Then, the mask 91 is removed by the CMP.

Next, as shown in FIG. 5B, a mask 92 is selectively formed on the surfaces of the drain layer 10, the drift region 11, the base region 12, and the source region 13. The mask 92 is made of a material, such as silicon oxide ($SiO_2$) or the like.

Figure 6A:
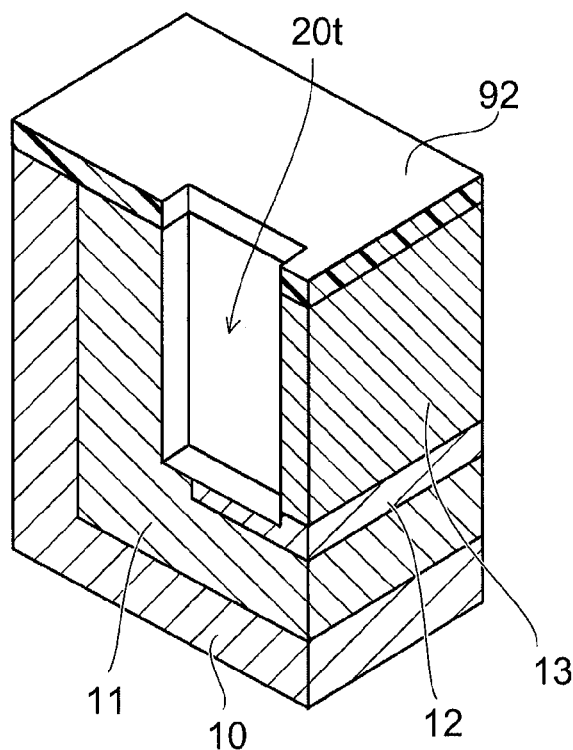
FIGS. 6A and 6B are schematic perspective views of main parts illustrating manufacturing processes of the semiconductor device according to the first embodiment, where
Figure 6B:
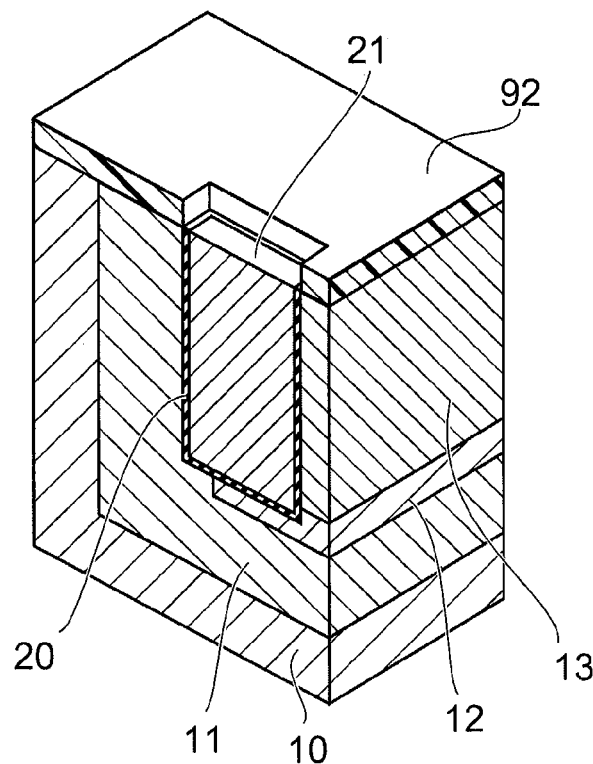

FIGS. 6A and 6B are schematic perspective views of main parts illustrating manufacturing processes of the semiconductor device according to the first embodiment. Specifically, FIG. 6A is a schematic perspective view of a main part of a process of etching the semiconductor substrate, and FIG. 6B is a schematic perspective view of a main part of a process of forming the gate electrode.

Next, as shown in FIG. 6A, etching is selectively performed on parts of the drift region 11, the base region 12, and the source region 13 respectively, which are exposed from the mask 92. As a result, a trench 20t is formed in parts of the drift region 11, the base region 12, and the source region 13, respectively. Then, the inside of the trench 20t is exposed under the oxidizing atmosphere at high temperatures.

With the foregoing processes, the gate insulating film 20 is formed on the side surface and the bottom surface of the trench 20t as shown in FIG. 6B. Then, the gate electrode 21 is formed in the trench 20t by the CVD (Chemical Vapor Deposition) via the gate insulating film 20. As a result, the gate electrode 21 in a trench shape is formed selectively from the respective surfaces of the parts of the base region 12 and the source region 13 adjacent to the base region 12, and a part of the drift region 11 on the side opposite to the part of the source region 13 to the inside. The gate electrode 21 is made of a material such as polysilicon (poly-Si) or the like. After the gate electrode 21 is formed, the mask 92 is removed.

Figure 7A:
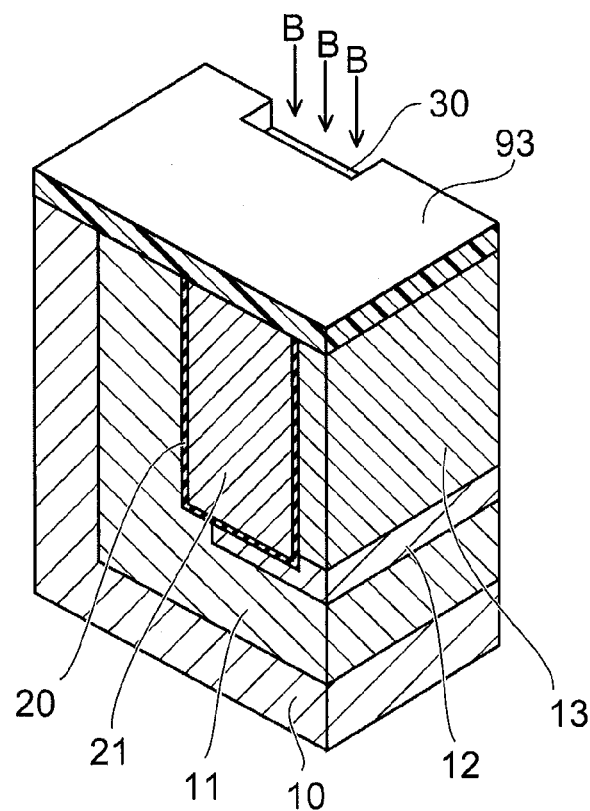
FIGS. 7A and 7B are schematic perspective views of main parts illustrating manufacturing processes of the semiconductor device according to the first embodiment, where
Figure 7B:
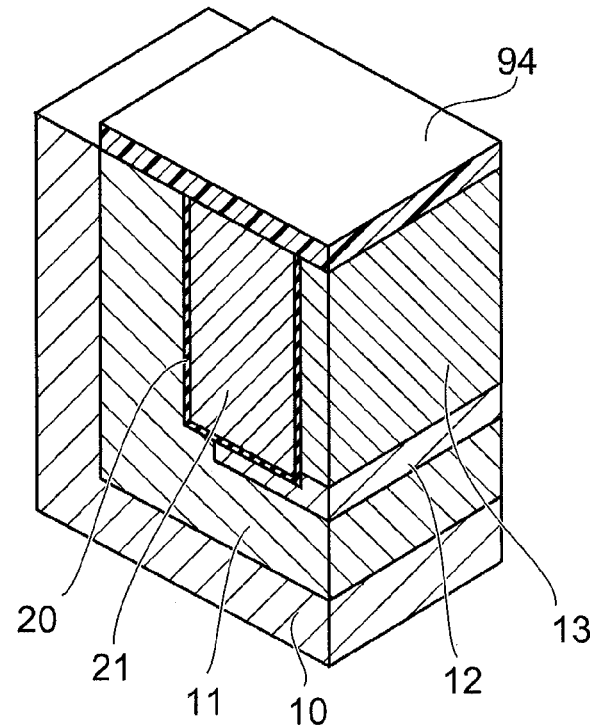

FIGS. 7A and 7B are schematic perspective views of main parts illustrating manufacturing processes of the semiconductor device according to the first embodiment. Specifically, FIG. 7A is a schematic perspective view of a main part of a process of implanting ions into the semiconductor substrate, and FIG. 7B is a schematic perspective view of a main part of a process of forming a mask.

Next, as shown in FIG. 7A, a mask 93 is selectively formed on the surfaces of the drain layer 10, the drift region 11, the base region 12, the source region 13, and the gate electrode 21. The mask 93 is made of a material, such as silicon oxide ($SiO_2$) or the like. Thereafter, p-type impurities (for instance, boron (B)) are ion-implanted into a part of the drift region 11, which is exposed from the mask 93. As a result, the p$^+$-type contact region 30 that has an impurity concentration higher than that of the base region 12 is selectively formed on the surface of the drift region 11 from the side of the drain layer 10 toward the base region 12.

Next, as shown in FIG. 7B, a mask 94 is selectively formed on the surfaces of the drift region 11, the base region 12, the source region 13, and the gate electrode 21. The mask 94 is made of a material such as silicon oxide ($SiO_2$) or the like.

Figure 8A:
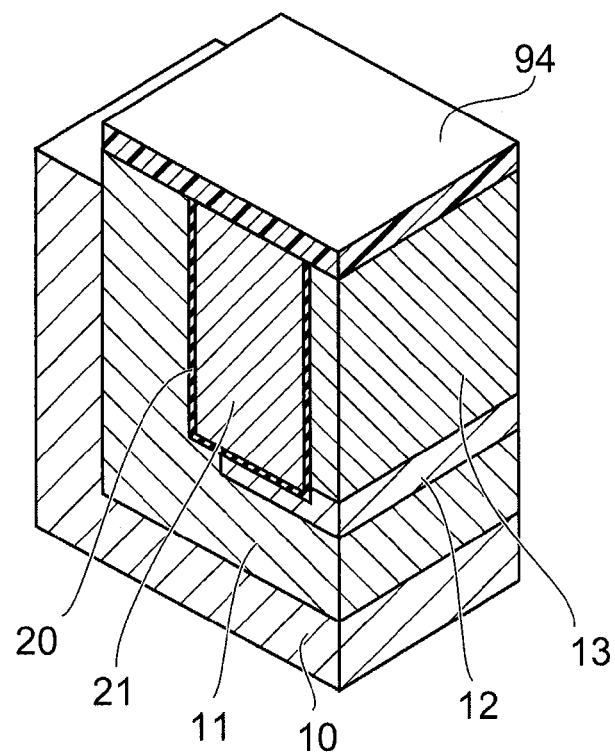
FIGS. 8A and 8B are schematic perspective views of main parts illustrating manufacturing processes of the semiconductor device according to the first embodiment, where
Figure 8B:
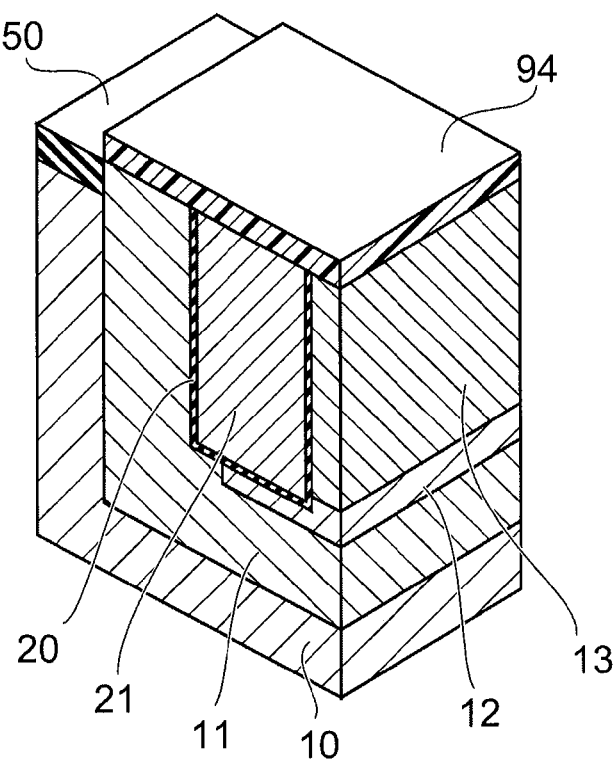

FIGS. 8A and 8B are schematic perspective views of main parts illustrating manufacturing processes of the semiconductor device according to the first embodiment. Specifically, FIG. 8A is a schematic perspective view of a main part of a process of etching the semiconductor substrate, and FIG. 8B is a schematic perspective view of a main part of a process of forming an insulating film.

Next, as shown in FIG. 8A, etching is performed on the part exposed from the mask 94, and the etch-back of the surface of the drain layer 10 is performed. Then, the insulating layer 50 is formed on the etch-backed portion, for example, by the CVD. This state is shown in FIG. 8B.

Thereafter, as shown in FIG. 1, and FIGS. 2A and 2B, the drain electrode 40 is connected to the drain layer 10. To the source region 13, the base region 12 and the contact region 30, the source electrode 41 is connected via the via electrode 45. The interlayer insulating film 46 is provided between the source electrode 41, and the drift region 11, the base region 12 and the source region 13. The semiconductor device 1 is formed by the foregoing manufacturing processes.

Next, the functional effect of the semiconductor device 1 will be explained.

Before explaining the functional effect of the semiconductor device 1, the function of a semiconductor device 100 according to a comparative example will be described.

Figure 9A:
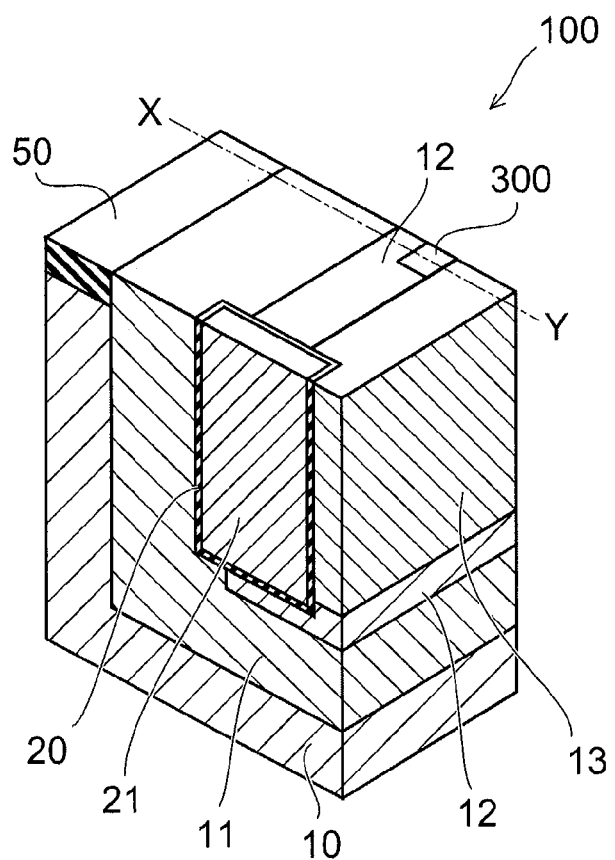
FIGS. 9A and 9B are schematic views of main parts of a semiconductor device according to a comparative example, where
Figure 9B:
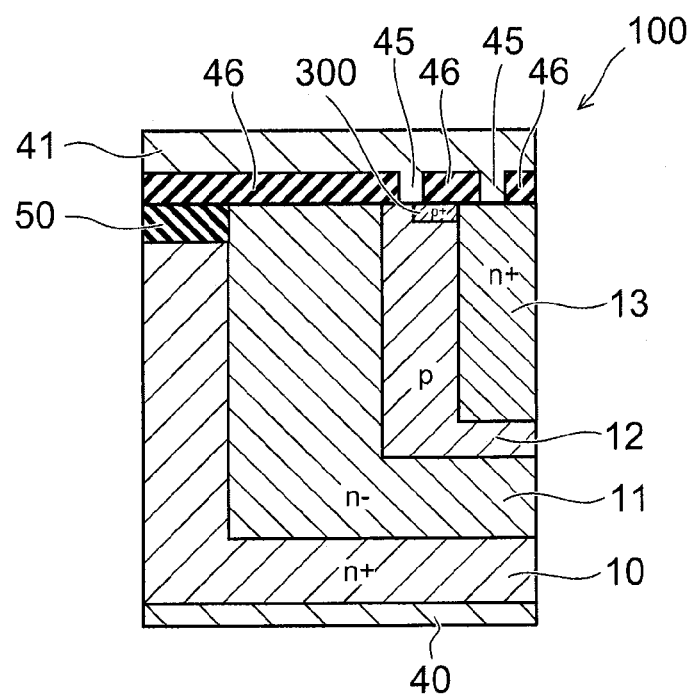

FIGS. 9A and 9B are schematic views of main parts of a semiconductor device according to a comparative example. Specifically, FIG. 9A is a schematic perspective view of a main part of the semiconductor device, and FIG. 9B is a schematic cross-sectional view of a main part along line X-Y of FIG. 9A. The drain electrode 40 and the source electrode 41 shown in FIG. 2B are not shown in FIG. 9A.

The configuration of the semiconductor device 100 according to the comparative example is substantially the same as that of the semiconductor device 1. In the semiconductor device 100, however, a $P^+$-type contact region 300 corresponding to the contact region 30 of the semiconductor device 1 is not provided on the surface of the drift region 11. In the semiconductor device 100, the contact region 300 is provided on the surface of the base region 12. The contact region 300 is adjacent to the source region 13. The contact region 300 is connected to the source electrode 41 via the via electrode 45.

A ground potential (or a negative potential) is applied to the source electrode 41 of the semiconductor device 100 according to the comparative example, and a positive potential is applied to the drain electrode 40. Furthermore, the gate electrode 21 of the semiconductor device 100 is set to have a threshold potential or higher to set the semiconductor device 100 in the on-state.

In the on-state of the semiconductor device 100, current flows across the source electrode 41 and the drain electrode 40. In the semiconductor device 100, the source region 13, the base region 12, and the drift region 11 are provided to extend in a direction substantially perpendicular to the major surface of the drain layer 10, respectively, and the gate electrode 21 in the trench is provided. Thus, the channel regions are formed both in a direction substantially parallel to and in a direction substantially perpendicular to the major surface of the drain layer 10. Therefore, the channel density significantly improves in the semiconductor device 100. In the on-state, since the source electrode 41 and the drain electrode 40 are conducted, a potential difference between the source electrode 41 and the drain electrode 40 becomes smaller than that in the off-state.

On the other hand, when the semiconductor device 100 is switched from the on-state to the off-state, a potential difference increases between the source electrode 41 and the drain electrode 40 abruptly. As a result, the potential difference temporarily exceeds a proper potential difference in the off-state, and an overvoltage is generated between the source electrode 41 and the drain electrode 40.

In this state, an avalanche breakdown may occur around the lower bottom part of the gate electrode 21 or on the junction interface between the base region 12 and the drift region 11, which in turn may generate hole pairs around the lower end portion of the gate electrode 21 or on the junction interface between the base region 12 and the drift region 11. Then, the holes as generated are carried to the base region 12. The holes carried into the base region 12 are discharged to the side of the source electrode 41 through the contact region 300 provided on the surface of the base region 12.

However, the impurity concentration of the base region 12 is set lower than that of the contact region 300 to determine a threshold voltage (Vt) of the transistor. Therefore, the resistance of the base region 12 is higher than the resistance of the contact region 300. Additionally, in the semiconductor device 100 (the three-dimensional MOSFET), the base region 12 is deeply dug down from the surface of the drift region 11 to the inside thereof.

Thus, in the semiconductor 100, holes are more likely to be collected in the base region 12 as compared to the generally used power MOSFETs. Therefore, as holes are carried into in the base region 12, a potential of the base region 12 increases. As a result, the parasitic bipolar transistor composed of the source region 13 ($n^+$-type), the base region 12 (p-type), and the drift region 11 ($n^-$-type) may operate.

As the operation of the parasitic bipolar transistor continues in the semiconductor device 100, a local temperature rise occurs in the source region 13, the base region 12 and the drift region 11. Then, holes are more and more likely to generate around the lower end portion of the gate electrode 21 and the junction interface between the base region 12 and the drift region 11. Thus, current crowding is likely to occur in the source region 13, the base region 12, and the drift region 11. As a result, a device breakdown may occur at smaller current than the target avalanche current in the semiconductor device 100.

In contrast, in the semiconductor device 1 according to the first embodiment, the $p^+$-type contact region 30 is provided on the surface of the drift region 11 from the side of the insulating layer 50 toward the base region 12. The contact region 30 is adjacent to the insulating layer 50 provided on the surface of the drain layer 10.

In the semiconductor device 1, since the $p^+$-type contact region 30 is located in the vicinity of the $n^+$-type drain layer 10 via the $n^-$-type drift region 11, a pn diode 25 is formed between the source electrode 41 and the drain electrode 40, in which the contract region 30 is the p-side and the drain layer 10 is the n-side.

In the semiconductor device 1, holes are likely to be generated around the pn diode 25 before an avalanche breakdown occurs around the lower end portion of the gate electrode 21 or the junction interface between the base region 12 and the drift region 11.

Figure 10:
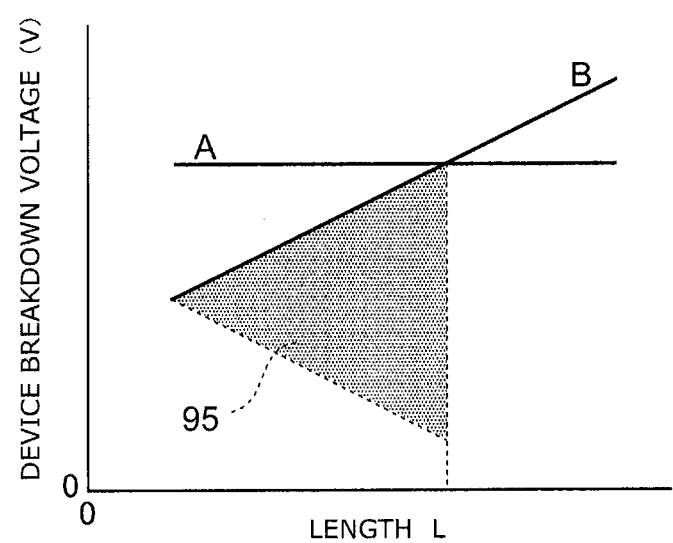
FIG. 10 illustrates a relationship between a step between a lower surface of a contact region and a lower surface of an insulating layer, and a device breakdown voltage.

For example, the relationship between the step of a length L between the lower surface of the contact region 30 and the lower surface of the insulating layer 50, and the device breakdown voltage of the semiconductor device 1 is shown in FIG. 10.

In FIG. 10, the horizontal axis indicates the above length L, and the vertical axis indicates the device breakdown voltage (V) of the semiconductor device 1.

The line A shows the relationship between the length L and the device breakdown voltage in the source region 13, the base region 12 and the drift region 11. In the line A, the device breakdown voltage does not change according to the length L. Namely, the device breakdown voltage in the source region 13, the base region 12, and the drift region 11 is independent from the length L.

In the line B, the shorter the length L is, the lower the device breakdown voltage becomes. This is because the shorter the length L is, the more a Zener breakdown by the pn diode 25 occurs. Therefore, the shorter the length L is, the more holes are likely to generate around the pn diode 25 in the semiconductor device 1. In the semiconductor device 1, the length L is adjusted to fall within the region 95 shown in FIG. 10.

In the semiconductor device 1, by adjusting the length L, an avalanche breakdown is likely to occur around the pn diode 25 before it occurs around the lower end portion of the gate electrode 21 or the junction interface between the base region 12 and the drift region 11. Namely, by adjusting the length L, the portion where holes are generated by the avalanche breakdown is shifted from the portion around the lower end portion of the gate electrode 21 or the junction interface between the base region 12 and the drift region 11 to the portion around the pn diode 25.

In other words, by adjusting the length L, the avalanche current generated in the semiconductor device 1 is determined by the avalanche current around the pn diode 25. The holes generated around the pn diode 25 are promptly discharged to the side of the source electrode 41 through the contact region 30 provided in the vicinity of the pn diode 25. In the semiconductor device 1, the pn diode 25 is provided outside the base region 12, so that the holes generated around the pn diode 25 are difficult to be carried into the base region 12.

As a result, in the semiconductor device 1, holes generated by the avalanche breakdown are more difficult to be carried into the base region 12 as compared to the case of the semiconductor device 100. Thus, in the semiconductor device 1, the bipolar action by the parasitic bipolar transistor is suppressed. As a result, the device breakdown voltage of the semiconductor device 1 improves more that that of the semiconductor device 100.

Next, another embodiment will be described. In the following explanations, elements identical with those of the semiconductor device 1 are denoted by the same reference numerals, and the detailed description thereof may be omitted as appropriate.

Second Embodiment

Figure 11A:
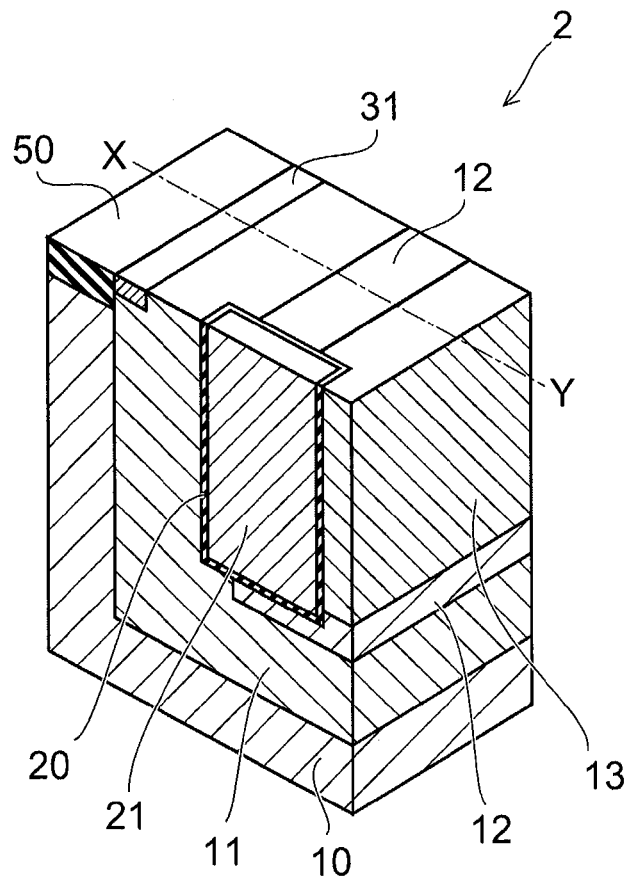
FIGS. 11A and 11B are schematic views of main parts of a semiconductor device according to a second embodiment, where
Figure 11B:
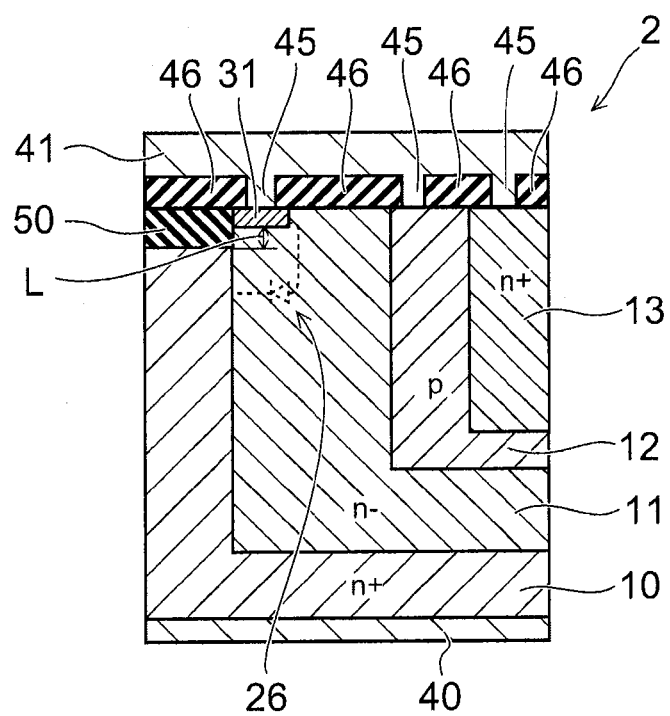

FIGS. 11A and 11B are schematic views of main parts of a semiconductor device according to a second embodiment. Specifically, FIG. 11A is a schematic perspective view of a main part of the semiconductor device, and FIG. 11B is a schematic cross-sectional view of a main part along line X-Y of FIG. 11A. Neither the drain electrode 40 nor the source electrode 41 shown in FIG. 11B are shown in FIG. 11A.

Figure 12:
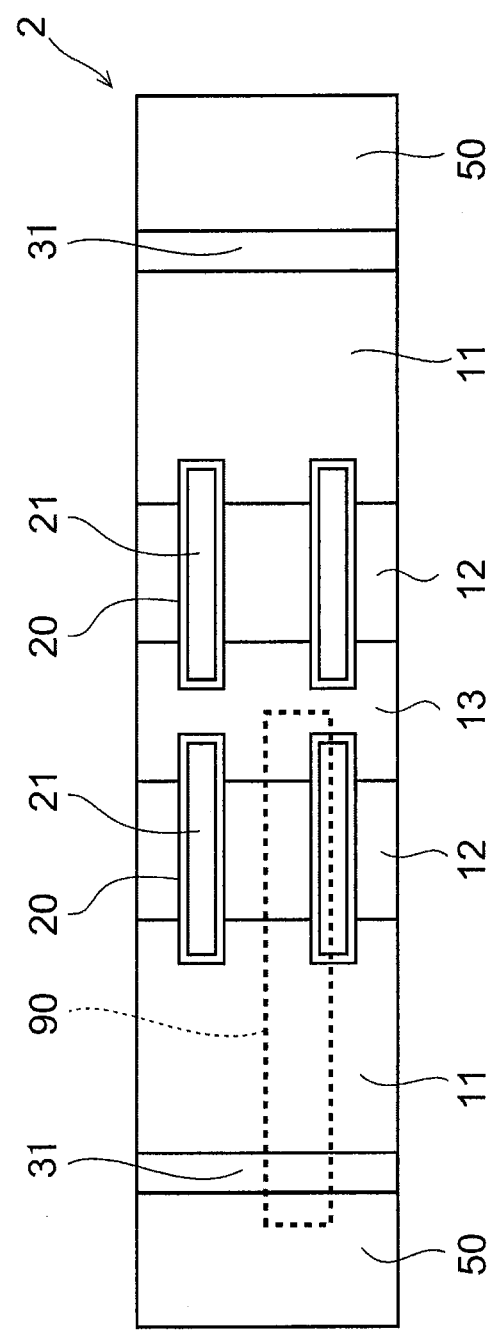
FIG. 12 is a schematic plan view of a main part of the semiconductor device according to the second embodiment.

FIG. 12 is a schematic plan view of a main part of the semiconductor device according to the second embodiment. FIGS. 11A and 11B show the portion enclosed by a region 90 shown in FIG. 12.

As shown in FIGS. 11A and 11B, in the semiconductor device 2, a P$^+$-type contact region 31 is selectively provided on the surface of the drift region 11 from the side of the drain layer 10 to the drift region 11. The contact region 31 which extends from the side of the insulating layer 50 ends on the halfway of the surface of the drift region 11. The impurity concentration of the contact region 31 is higher than that of the base region 12. The contact region 31 is, for example, a carrier extraction region which allows carriers (holes, for instance) generated in the semiconductor device 2 to be discharged to the source electrode 41.

The drain electrode 40 is connected to the drain layer 10. The source electrode 41 is connected to the source region 13, the base region 12 and the contact region 31 via the via electrode 45. On the surface of the drain layer 10 under the interlayer insulating film 46, the insulating layer 50 is provided. The insulating layer 50 is adjacent to the contact region 31. A step of a length L is provided between the lower surface of the contact region 31 and the lower surface of the insulating layer 50. The drift region 11 and the insulating layer 50 are provided between the contact region 31 and the drain layer 10.

In the semiconductor device 2, the p$^+$-type contact region 31 is provided in the vicinity of the n$^+$-type drain layer 10 via the n$^-$-type drift region 11. Thus, a pn diode 26 is formed between the source electrode 41 and the drain electrode 40, in which the contact region 31 is the p-side, and the drain layer 10 is the n-side. The pn diode 26 is formed in the vicinity of the insulating layer 50.

As shown in FIG. 12, in the plane of the semiconductor device 2, the contact region 31 is adjacent to the drift region 11. The drift region 11 is adjacent to the base region 12. The base region 12 is adjacent to the source region 13 on the opposite side of the drift region 11. The gate electrode 21 is provided from the source region 13 to the drift region 11 via the base region 12. The gate insulating film 20 is provided between the gate electrode 21, and the drift region 11, the base region 12 and the source region 13.

In the plane of the semiconductor device 2, the drift regions 11, the base regions 12 and the gate electrodes 21 are arranged to be line symmetrical with the source region 13 as the center. The contact region 31 is in contact with the insulating layer 50 on the opposite side of the drift region 11. In the semiconductor device 2, for example, units shown in FIG. 12 are periodically arranged in a direction parallel to the major surface of the drain layer 10.

In the semiconductor device 2 according to the second embodiment, the p$^+$-type contact region 31 is provided on the surface of the drift region 11 from the side of the insulating layer 50 toward the base region 12. The contact region 31 is adjacent to the insulating layer 50 provided on the surface of the drain layer 10. The contact region 31 extends on the surface of the drift region 11 along the junction interface between the insulating layer 50 and the drift region 11. In the semiconductor device 2, the p$^+$-type contact region 31 is provided in the vicinity of the n$^+$-type drain layer 10 via the n$^-$-type drift region 11. Thus, a pn diode 26 is formed between the source electrode 41 and the drain electrode 40, in which the contact region 31 is the p-side, and the drain layer 10 is the n-side.

As in the semiconductor 1, in the semiconductor device 2, by adjusting the length L, an avalanche breakdown is likely to occur around the pn diode 26 before it occurs around the lower end portion of the gate electrode 21 or the junction interface between the base region 12 and the drift region 11. Namely, by adjusting the length L, the portion where holes are generated by the avalanche breakdown is shifted to the portion around the pn diode 26 from the portion around the lower end portion of the gate electrode 21 or the junction interface between the base region 12 and the drift region 11.

In other words, by adjusting the length L, the avalanche current generated in the semiconductor device 2 is determined by the avalanche current around the pn diode 26. The holes generated around the pn diode 26 are promptly discharged to the side of the source electrode 41 through the contact region 31 provided in the vicinity of the pn diode 26.

As a result, in the semiconductor device 2, holes generated by the avalanche breakdown are difficult to be carried into the base region 12 as compared to the semiconductor device 100. Therefore, the bipolar action by the parasitic bipolar transistor is suppressed in the semiconductor device 2. As a result, the device breakdown voltage of the semiconductor device 2 improves more than that of the semiconductor device 100 according to the comparative example.

Variation of Second Embodiment

In a variation of the second embodiment, the arrangement of the gate electrode 21 in the plane of the semiconductor device 2 is changed.

Figure 13A:
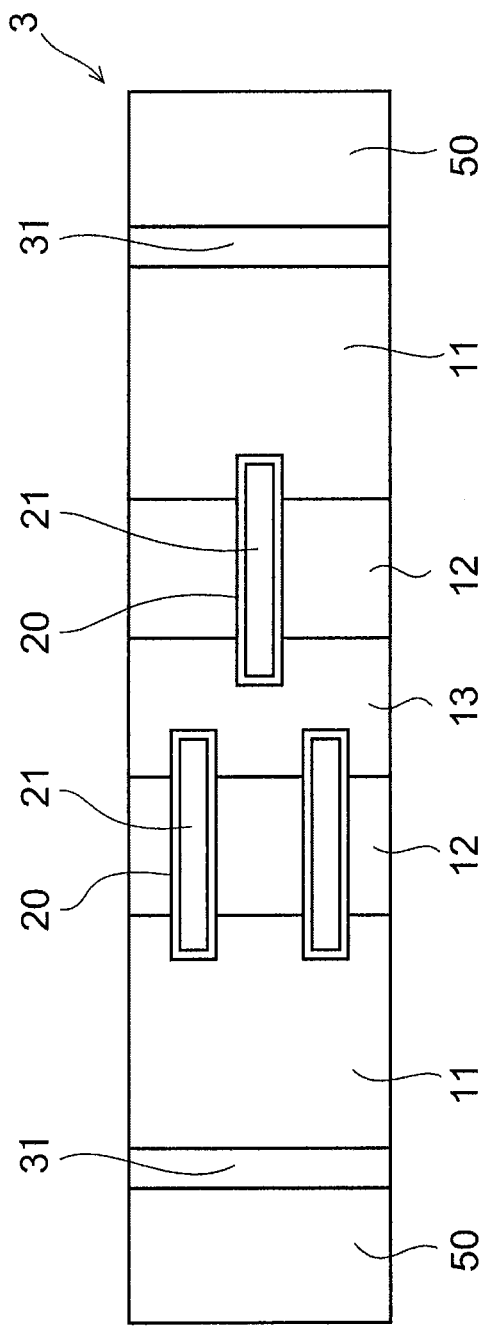
FIGS. 13A and 13B are schematic plan views of main parts of a variation of the semiconductor device according to the second embodiment.
Figure 13B:
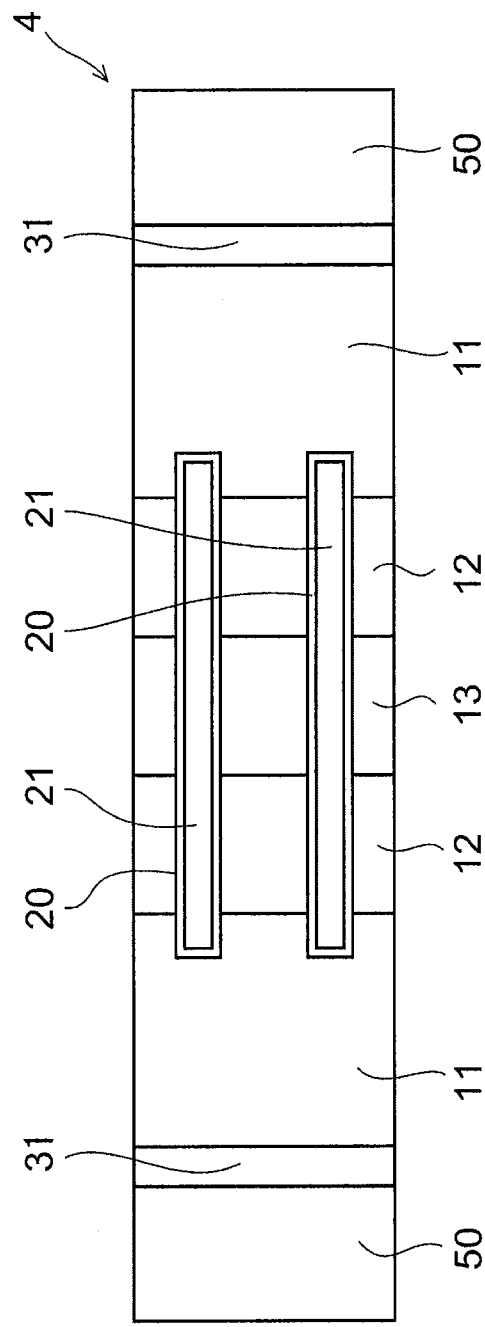

FIGS. 13A and 13B are schematic plan views of main parts of a variation of the semiconductor device according to the second embodiment.

As shown in FIG. 13A, in the plane of a semiconductor device 3, the contact region 31 is adjacent to the drift region 11. The drift region 11 is adjacent to the base region 12. The base region 12 is adjacent to the source region 13 on the opposite side of the drift region 11. The source region 13 is sandwiched by the base regions 12, and the source region 13 and the base regions 12 are sandwiched by the drift regions 11. The gate electrode 21 is provided from a part of the source region 13 to a part of the drift region 11 via the base region 12. The gate insulating film 20 is provided between the gate electrode 21, and the drift region 11, the base region 12 and the source region 13.

In the plane of the semiconductor device 3, between the adjacent base regions 12, the respective cycles of the gate electrodes 21 do not match one another in the extending direction of the base regions 12. For example, between the adjacent base regions 12, the gate electrode 21 provided in one of the base regions 12 is disposed between the gate electrodes 21 provided in the other base region 12. In other words, pitches at which first gate electrodes 21 penetrating through a first base region 12 adjacent to the source region 13 are arranged in an extending direction of the first base region 12 do not coincide with pitches at which second gate electrodes 21 penetrating through a second base region 12 adjacent to the source region 13 on the opposite side of the first base region 12 are arranged in an extending direction of the second base region 12.

As shown in FIG. 13B, in the plane of a semiconductor device 4, the contact region 31 is adjacent to the drift region 11. The drift region 11 is adjacent to the base region 12. The base region 12 is adjacent to the source region 13 on the opposite side of the drift region 11. The source region 13 is sandwiched by the base region 12s, and the source region 13 and the base regions 12 are sandwiched by the drift regions 11. The gate electrode 21 is provided from a part of the source region 13 to a part of the drift region 11 via the base region 12. The gate insulating film 20 is provided between the gate electrode 21, and the drift region 11, the base region 12 and the source region 13.

In the plane of the semiconductor device 4, the gate electrode 21 is disposed in the source region 13, a part of the base region 12 disposed on both sides of the source region 13 over the source region 13 and a part of the drift region 11 adjacent to the base region 12. In other words, the gate electrode 21 penetrates through the source region 13, the first base region 12 adjacent to the source region 13, and the second base region 12 adjacent to the source region 13 on the opposite side of the first base region 12.

In the semiconductor devices 3 and 4, for example, units shown in FIGS. 13A and 13B are periodically arranged in a direction parallel to the major surface of the drain layer 10. The foregoing embodiment is also encompassed in the second embodiment.

Third Embodiment

Figure 14A:
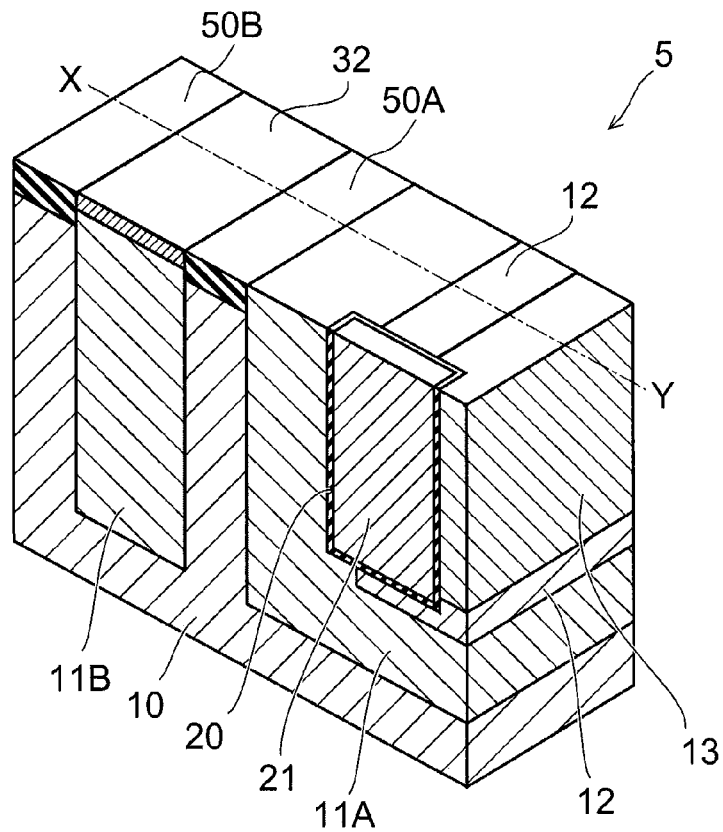
FIGS. 14A and 14B are schematic views of main parts of a semiconductor device according to a third embodiment, where
Figure 14B:
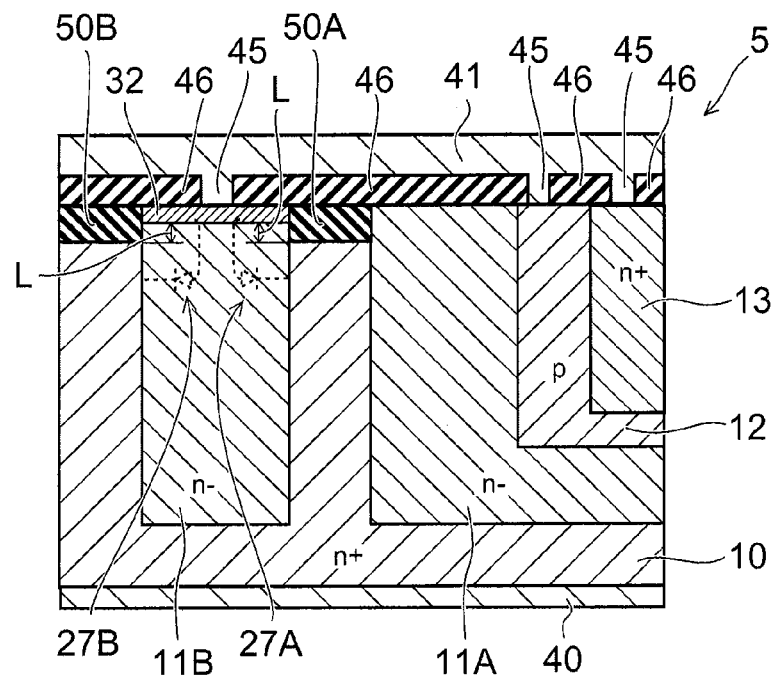

FIGS. 14A and 14B are schematic views of main parts of a semiconductor device according to a third embodiment. Specifically, FIG. 14A is a schematic perspective view of a main part of the semiconductor device, and FIG. 14B is a schematic cross-sectional view of a main part along line X-Y of FIG. 14A.

In a semiconductor device 5, the drift region is separated into plural via the drain layer 10. For example, the drift region is divided into a first drift region 11A and a second drift region 11B via the drain layer 10. The base region 12 is provided selectively from the surface of the first drift region 11A to the inside thereof. A p-type contact region 32 that is a carrier extraction region is selectively provided on the surface of the second drift region 11B adjacent to the drift region 11A via the drain layer 10. The contact region 32 extends from the side of the drain layer 10 toward the drift region 11A. The drift region 11A and the drift region 11B may have the same depth or have a step. The insulating layers 50A and 50B are provided on the drain layer 10.

The base region 12 is selectively provided from the surface of the drift region 11A to the inside thereof. The source region 13 is selectively provided from the surface of the base region 12 to the inside thereof. The gate electrode 21 is selectively provided via the gate insulating film 20 from the surfaces of the base region 12, a part of the source region 13 adjacent to the base region 12, and a part of the drift region 11 on the opposite side of the above part of the source region 13 having the base region 12 in between to the inside thereof.

In the semiconductor device 5, the contact region 32 is selectively provided on the surface of the drift region 11B. The contact region 32 has an impurity concentration higher than that of the base region 12.

The drain electrode 40 is connected to the drain layer 10. The source electrode 41 is connected to the source region 13, the base region 12 and the contact region 32 via the via electrode 45. The interlayer insulating film 46 is provided between the source electrode 41, and the drift regions 11A and 11B, the base region 12 and the source region 13. The insulating layers 50A and 50B are provided on the surface of the drain layer 10 under the interlayer insulating film 46. The insulating layers 50A and 50B are adjacent to the contact region 32. A step of a length L is provided between the lower surface of the contact region 32 and the lower surface of the insulating layers 50A and 50B.

In the semiconductor device 5, the $p^+$-type contact region 30 is provided in the vicinity of the $n^+$-type drain layer 10 via the $n^-$-type drift region 11. Thus, pn diodes 27A and 27B are formed between the source electrode 41 and the drain electrode 40, in which the contact region 32 is the p-side, and the drain layer 10 is the n-side. The pn diode 27A is formed in the vicinity of the insulating layer 50B. The pn diode 27A is formed in the vicinity of the insulating layer 50A. The pn diode 27B is formed in the vicinity of the insulating layer 50B.

As in the semiconductor 1, in the semiconductor device 5, by adjusting the length L, an avalanche breakdown is likely to occur around the pn diodes 27A and 27B before it occurs around the lower end portion of the gate electrode 21 or the junction interface between the base region 12 and the drift region 11A. Namely, by adjusting the length L, the portion where holes are generated by the avalanche breakdown is shifted from the portion around the lower end portion of the gate electrode 21 or the junction interface between the base region 12 and the drift region 11A to the portion around the pn diodes 27A and 27B.

In other words, by adjusting the length L, the avalanche current generated in the semiconductor device 5 is determined by the avalanche current around the pn diodes 27A and 27B. The holes generated around the pn diodes 27A and 27B are promptly discharged to the side of the source electrode 41 via the contact region 32 provided in the vicinity of the pn diodes 27A and 27B.

As a result, in the semiconductor device 5, holes generated by the avalanche breakdown are difficult to be carried into the base region 12 as compared to the semiconductor device 100. Therefore, the bipolar action by the parasitic bipolar transistor is suppressed in the semiconductor device 5. As a result, the device breakdown voltage of the semiconductor device 5 improves more than that of the semiconductor device 100 according to the comparative example.

In the semiconductor device 5, the pn diodes 27A and 27B are provided at positions still further from the base region 12 as compared to the semiconductor devices 1 to 4. Thus, the holes generated around the pn diodes 27A and 27B are more difficult to be carried into the base region 12. Therefore, in the semiconductor device 5, the device breakdown voltage further improves by further suppressing the bipolar action as compared to the semiconductor devices 1 to 4.

Fourth Embodiment

Figure 15A:
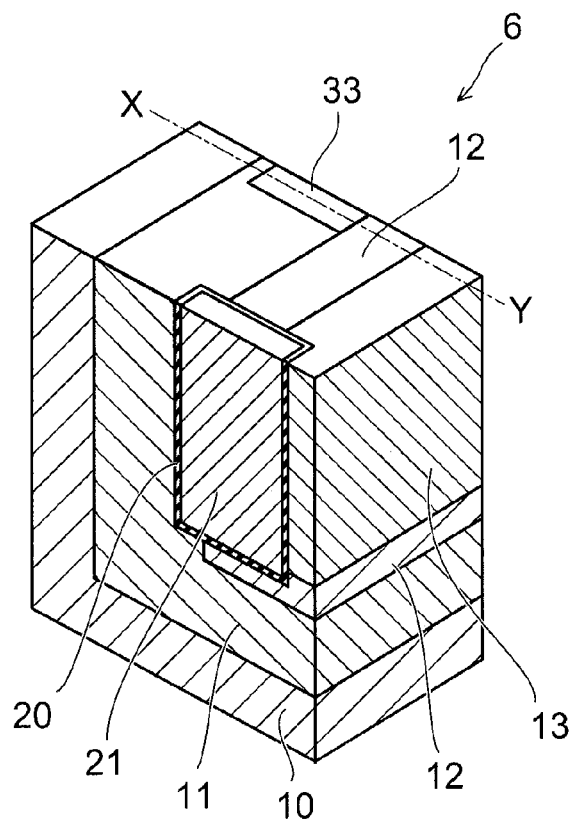
FIGS. 15A and 15B are schematic views of main parts of a semiconductor device according to a fourth embodiment, where
Figure 15B:
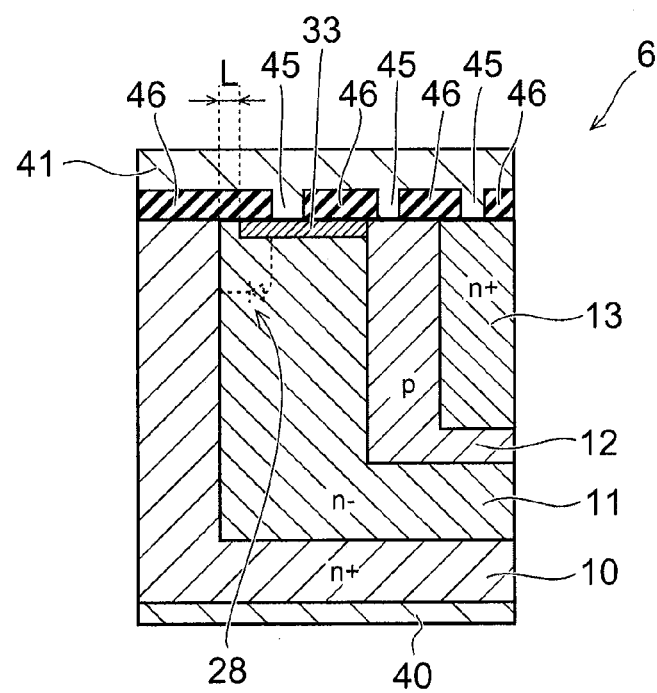

FIGS. 15A and 15B are schematic views of main parts of a semiconductor device according to a fourth embodiment. Specifically, FIG. 15A is a schematic perspective view of a main part of the semiconductor device, and FIG. 15B is a schematic cross-sectional view of a main part along line X-Y of FIG. 15A.

In a semiconductor device 6, the drift region 11 is selectively provided from the surface of the drain layer 10 to the inside of the drain layer 10. The base region 12 is selectively provided from the surface of the first drift region 11 to the inside thereof. The source region 13 is selectively provided from the surface of the base region 12 to the inside thereof. The gate electrode 21 is selectively provided via the gate insulating film 20 from the surfaces of the base region 12, a part of the source region 13 adjacent to the base region 12, and a part of the drift region 11 on the opposite side of the above part of the source region 13 having the base region 12 in between to the inside thereof.

In the semiconductor device 6, a p-type contact region 33 that is a carrier extraction region is selectively provided on the surface of the second drift region 11. The contact region 33 extends from the side of the drain layer 10 toward the drift region 11. The contact region 33 has an impurity concentration higher than that of the base region 12.

The drain electrode 40 is connected to the drain layer 10. The source electrode 41 is connected to the source region 13, the base region 12 and the contact region 32 via the via electrode 45. The interlayer insulating film 46 is provided between the source electrode 41, and the drift region 11, the base region 12 and the source region 13.

In the semiconductor device 6, the p$^+$-type contact region 33 is provided in the vicinity of the n$^+$-type drain layer 10 with an interval of a length L via the n$^-$-type drift region 11. The drift region 11 is provided between the contact region 33 and the drain layer 10. Thus, a pn diode 28 is formed between the source electrode 41 and the drain electrode 40, in which the contact region 33 is the p-side, and the drain layer 10 is the n-side.

As in the semiconductor 1, in the semiconductor device 6, an avalanche breakdown is likely to occur around the pn diode 28 before it occurs around the lower end portion of the gate electrode 21 or the junction interface between the base region 12 and the drift region 11. Namely, by adjusting the length L, the portion where holes are generated by the avalanche breakdown is shifted to the portion around the pn diode 28 from the portion around the lower end portion of the gate electrode 21 or the junction interface between the base region 12 and the drift region 11.

In other words, by adjusting the length L, the avalanche current generated in the semiconductor device 6 is determined by the avalanche current around the pn diode 28. The holes generated around the pn diode 28 are promptly discharged to the side of the source electrode 41 through the contact region 33 provided in the vicinity of the pn diode 28.

As a result, in the semiconductor device 6, holes generated by the avalanche breakdown are difficult to be carried into the base region 12 as compared to the semiconductor device 100. Therefore, the bipolar action by the parasitic bipolar transistor is suppressed in the semiconductor device 6. As a result, the device breakdown voltage of the semiconductor device 6 improves more than that of the semiconductor device 100 according to the comparative example.

Fifth Embodiment

Figure 16A:
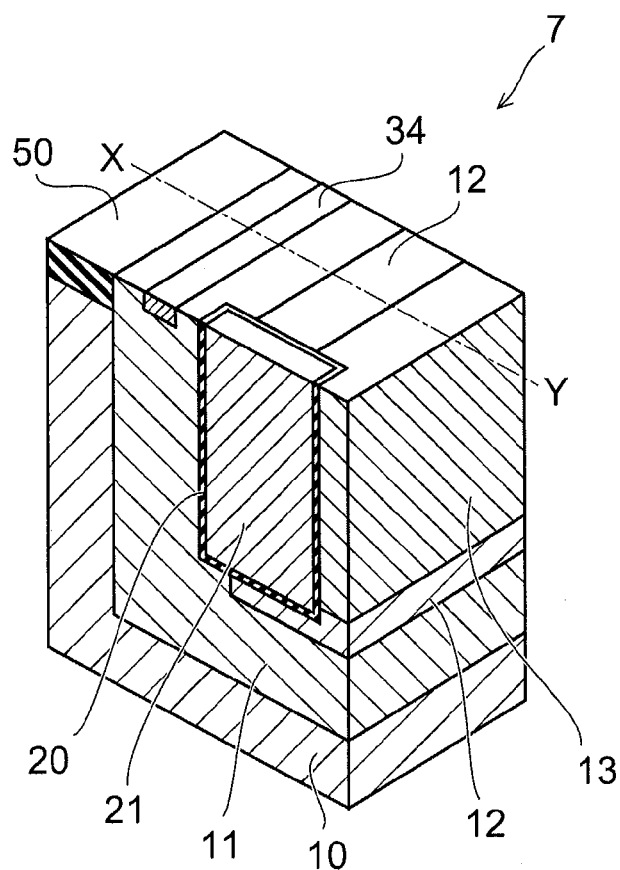
FIGS. 16A and 16B are schematic views of main parts of a semiconductor device according to a fifth embodiment, where
Figure 16B:
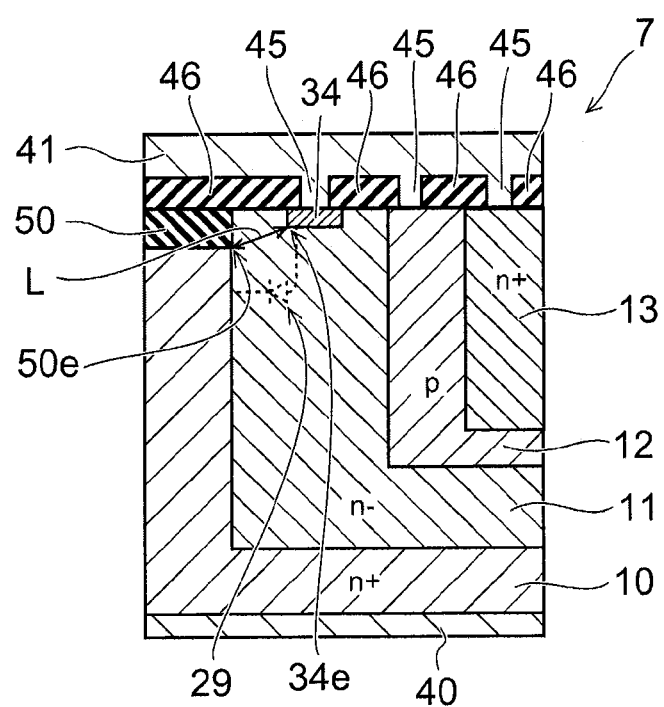

FIGS. 16A and 16B are schematic views of main parts of a semiconductor device according to a fifth embodiment. Specifically, FIG. 16A is a schematic perspective view of a main part of the semiconductor device, and FIG. 16B is a schematic cross-sectional view of a main part along line X-Y of FIG. 16A.

In a semiconductor device 7, the drift region 11 is selectively provided from the surface of the drain layer 10 to the inside of the drain layer 10. The base region 12 is selectively provided from the surface of the first drift region 11 to the inside thereof. The source region 13 is selectively provided from the surface of the base region 12 to the inside thereof. The gate electrode 21 is selectively provided via the gate insulating film 20 from the surfaces of the base region 12, parts of the source region 13 adjacent to the base region 12, and parts of the drift region 11 on the opposite side of the above parts of the source region 13 having the base region 12 in between to the inside thereof.

In the semiconductor device 7, a p-type contact region 34 that is a carrier extraction region is selectively provided on the surface of the second drift region 11. The contact region 33 faces the insulating layer 50 and extends in a direction substantially parallel to the insulating layer 50. The contact region 34 is not adjacent to the insulating layer 50 and is disposed apart from the insulating layer 50. The contact region 34 has an impurity concentration higher than that of the base region 12.

The drain electrode 40 is connected to the drain layer 10. The source electrode 41 is connected to the source region 13, the base region 12 and the contact region 33 via the via electrode 45. The interlayer insulating film 46 is provided between the source electrode 41, and the drift region 11, the base region 12 and the source region 13.

The end portion 34e of the bottom surface of the p$^+$-type contact region 34 is apart from the end portion 50e of the bottom surface of the insulating layer 50 by the length L. The drift region 11 is provided between the contact region 34 and the drain layer 10. Thus, a pn diode 29 is formed between the source electrode 41 and the drain electrode 40, in which the contact region 34 is the p-side, and the drain layer 10 is the n-side.

As in the semiconductor 1, in the semiconductor device 7, by adjusting the length L, an avalanche breakdown is likely to occur around the pn diode 29 before it occurs around the lower end portion of the gate electrode 21 or the junction interface between the base region 12 and the drift region 11. Namely, by adjusting the length L, the portion where holes are generated by the avalanche breakdown is shifted from the portion around the lower end portion of the gate electrode 21 or the junction interface between the base region 12 and the drift region 11 to the portion around the pn diode 29.

In other words, by adjusting the length L, the avalanche current generated in the semiconductor device 7 is determined by the avalanche current around the pn diode 29. The holes generated around the pn diode 29 are promptly discharged to the side of the source electrode 41 through the contact region 34 provided in the vicinity of the pn diode 29.

As a result, according to the semiconductor device 7, holes generated by the avalanche breakdown are difficult to be carried into the base region 12 as compared to the semiconductor device 100. Therefore, the bipolar action by the parasitic bipolar transistor is suppressed in the semiconductor device 7. As a result, the device breakdown voltage of the semiconductor device 7 improves more than that of the semiconductor device 100.

In the foregoing, embodiments of the invention have been described with reference to examples.

The semiconductor devices 1 to 7 according to the first to fifth embodiments include: the n-type drift region 11, 11A, 11B selectively provided in the drain layer 10 from the surface of the n-type drain layer 10 to the inside thereof; the p-type base region 12 selectively provided in the drift region 11, 11A from the surface of the drift region 11, 11A to the inside thereof; and the n-type source region 13 selectively provided in the base region 12 from the surface of the base region 12 to the inside thereof. Further, the contact region 30 to 34 which serves a carrier extraction region extends from the side of the drain layer 10 toward the drift region 11, 11B. The contact region 30 to 34 is not in contact with the drain layer 10.

However, the embodiments are not limited to these specific examples. More specifically, those skilled in the art can suitably modify these examples, and such modifications are also encompassed within the scope of the invention as long as they have the characteristic of the embodiment. For instance, the layout, material, condition, shape, size and the like of the components included in the above examples are not limited to those illustrated, but can be suitably modified. Additionally, the foregoing embodiments are not necessarily be independent from one another but may be suitably combined. In the embodiment, the n-type may be indicated as a first conductivity-type, and the p-type may be indicated as a second conductivity-type. Similarly, the n-type may be indicated as the second conductivity-type, and the p-type may be indicated as the first conductivity-type. Such modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a drift region of a first conductivity type selectively provided in a drain layer of the first conductivity type from a surface of the drain layer to an inside of the drain layer;
    a base region of a second conductivity type selectively provided in the drift region from a surface of the drift region to an inside of the drift region;
    a source region of the first conductivity type selectively provided in the base region from a surface of the base region to an inside of the base region;
    a gate electrode in a trench shape penetrating from a part of the source region through the base region adjacent to the part of the source region to reach a part of the drift region in a direction substantially parallel to a major surface of the drain layer;
    a contact region of the second conductivity type selectively provided on the surface of the drift region, the contact region containing an impurity having a concentration higher than an impurity concentration of the base region;
    a drain electrode connected to the drain layer; and
    a source electrode connected to the source region and the contact region, wherein a portion of the source electrode is directly connected to said contact region,
    the contact region extending from a side of the drain layer toward the drift region and not contacting the drain layer.

2. The device according to claim 1, wherein the drift region is provided between the contact region and the drain layer.

3. The device according to claim 1, wherein the contact region extends from the side of the drain layer toward the drift region on the surface of the drift region.

4. The device according to claim 1, wherein the contact region extends from the side of the drain layer toward the drift region on the surface of the drift region, and further contacts the base region.

5. The device according to claim 1, wherein an insulating layer is further provided on the drain layer.

6. The device according to claim 5, wherein the insulating layer is in contact with the contact region and the drift region.

7. The device according to claim 5, wherein the contact region extends substantially parallel to the insulating layer on the surface of the drift region and is disposed apart from the insulating layer.

8. The device according to claim 5, wherein a step exists between a lower surface of the contact region and a lower surface of the insulating layer.

9. The device according to claim 1, wherein the contact region is sandwiched between a first portion of the drift region and a second portion of the drift region as viewed in a direction perpendicular to the surface of the drift region.

10. The device according to claim 1, wherein as viewed in a direction perpendicular to the surface of the drift region, the gate electrode extends to the drift region, and the contact region extends from the side of the drain layer to the drift region between the date electrode and an adjacent date electrode.

11. The device according to claim 1, wherein the contact region extends from the side of the drain layer toward the drift region on the surface of the drift region and ends on a halfway of the surface of the drift region.

12. The device according to claim 1, wherein
    an insulating layer is further provided on the drain layer,
    the insulating layer is in contact with the contact region and the drift region, and
    the contact region extends along an interface between the insulating layer and the drift region on the surface of the drift region.

13. The device according to claim 1, wherein as viewed in a direction perpendicular to the surface of the drift region, pitches at which first gate electrodes penetrating through a first base region adjacent to the source region are arranged in an extending direction of the first base region do not coincide with pitches at which second gate electrodes penetrating through a second base region adjacent to the source region on a side opposite to the first base region are arranged in an extending direction of the second base region.

14. The device according to claim 1, wherein as viewed in a direction perpendicular to the surface of the drift region, the gate electrode penetrates through the source region, a first base region adjacent to the source region, and a second base region adjacent to the source region on a side opposite to the first base region.

15. The device according to claim 1, wherein
the drift region is divided into a first drift region and a second drift region via the drain layer,
the base region is selectively provided from a surface of the first drift region to an inside of the first drift region, and
the contact region is selectively provided on a surface of a second drift region adjacent to the first drift region via the drain layer.

* * * * *